United States Patent [19]

Sage

[11] Patent Number: 5,444,751
[45] Date of Patent: Aug. 22, 1995

[54] TUNNEL DIODE SHIFT REGISTER UTILIZING TUNNEL DIODE COUPLING

[75] Inventor: Jay P. Sage, Newton, Mass.

[73] Assignee: Massachusetts Institute of Technology, Cambridge, Mass.

[21] Appl. No.: 126,550

[22] Filed: Sep. 24, 1993

[51] Int. Cl.$^6$ .................. G11C 19/00; H03K 23/80
[52] U.S. Cl. .................. 377/78; 377/128; 327/568; 327/570
[58] Field of Search .................. 307/322–325; 377/128, 78; 327/570, 568

[56] References Cited

U.S. PATENT DOCUMENTS

| | | | |
|---|---|---|---|
| 3,102,962 | 9/1963 | Horna | 307/88.5 |
| 3,103,597 | 9/1963 | Novick et al. | 307/88.5 |
| 3,127,525 | 3/1964 | Rabinovici | 307/88.5 |
| 3,152,264 | 10/1964 | Ergott, Jr. et al. | 307/88.5 |
| 3,168,652 | 2/1965 | Kaufman | 307/88.5 |
| 3,209,158 | 9/1965 | Neff et al. | 307/88.5 |
| 3,218,474 | 11/1965 | Crouse | 307/88.5 |
| 3,249,766 | 5/1966 | Bourget | 307/88.5 |
| 3,341,715 | 9/1967 | Sear | 307/88.5 |
| 3,376,430 | 4/1968 | Smith | 377/128 |
| 3,582,972 | 6/1971 | Terrier | 377/128 |
| 3,655,214 | 5/1972 | Krambeck | 307/24 |
| 3,813,558 | 5/1974 | Krick et al. | 307/206 |
| 5,237,596 | 8/1993 | Lin | 377/128 |

FOREIGN PATENT DOCUMENTS 0051718 2/1989 Japan ...................... 377/128

OTHER PUBLICATIONS

Aleksander, I., and R. W. A. Scarr, "Tunnel Devices as Switching Elements", Journal of the British Institute of Radio Engineers, Mar. 1962, pp. 177–192.

Primary Examiner—Margaret Rose Wambach
Attorney, Agent, or Firm—Samuels, Gauthier & Stevens

[57] ABSTRACT

A shift register having a first bistable latching circuit operable for switching between a low voltage state and a high voltage state in response to receiving an input current and a first clock voltage pulse. A second bistable latching circuit operable for switching from said low voltage state to the high voltage state in response to receiving a switching current induced from the first bistable latching circuit and a second clock voltage pulse. A clock voltage pulse source operable for successively providing clock voltage pulses in phase sequence to the first and second bistable latching circuits. A coupling circuit coupled between the first and second bistable latching circuits and having electrical characteristics such that the coupling circuit generates the switching current for a predetermined voltage drop across the coupling circuit in response to the first bistable latching circuit being in the high voltage state, the coupling circuit generating currents of lesser value than the switching current for voltage drops which are lesser or greater than the predetermined voltage drop.

25 Claims, 4 Drawing Sheets

TUNNEL DIODE SHIFT REGISTER UTILIZING TUNNEL DIODE COUPLING this invention was made with government support under Contract Number F19628-90-C-0002 awarded by the Air Force. The government has certain rights in the invention.

BACKGROUND OF THE INVENTION

The invention relates to a digital shift register which utilizes tunnel diodes in the interstage coupling circuitry connecting successive latches.

Resonant-tunneling diodes (RTDs), because of their very high ratio of Current density to specific capacitance, are capable of switching extremely rapidly. For example, oscillators have been configured which operate above 700 GHz. Building complex logic circuits from two-terminal devices, however, poses a greater challenge. For one thing, the devices have to switch over a wide voltage range and cannot be restricted to the highest speed part of their operating range. For another, the same terminal has to be used as both the input and the output, making isolation a problem. The present invention provides a new approach for realizing a digital shift register using RTDs that is expected, based on simulations, to reach speeds in the 50 GHz range with low power consumption. The circuit requires few component types, e.g., tunnel diodes (TDs) and Schottky diodes only, provides relatively wide operating margins, and is capable of fan-in and fan-out operations.

SUMMARY OF THE INVENTION

According to the present invention, there is provided a shift register including a first bistable latching circuit operable for switching between a low voltage state and a high voltage state in response to receiving an input current and a first clock voltage pulse; a Second bistable latching circuit operable for switching from said low voltage state to the high voltage state in response to receiving a switching current induced from the first bistable latching circuit and a second clock voltage pulse; a clock voltage pulse source operable for successively providing clock voltage pulses in phase sequence to the first and second bistable latching circuits; and a coupling circuit coupled between the first and second bistable latching circuits and having electrical characteristics such that the coupling circuit generates the switching current for a predetermined voltage drop across the coupling circuit in response to the first bistable latching circuit being in the high voltage state. The coupling circuit is operable for generating currents of lesser value than the switching current for voltage drops which are lesser or greater than the predetermined voltage drop.

According to an alternate embodiment of the present invention there is provided a shift register including a plurality of bistable latching circuits coupled to one another, each of the latching circuits being operable for switching between a low voltage state and a high voltage state in response to receiving a switching current induced from a preceding latching circuit and a clock voltage pulse; a clock voltage pulse source operable for successively providing clock voltage pulses in phase sequence to the plurality of bistable latching circuits; and a plurality of coupling circuits respectively disposed between and electrically coupling each of the succeeding bistable latching circuits, each of the coupling circuits including a tunnel diode which generates said switching current in response to a preceding latching circuit being in said high voltage state.

DETAILED DESCRIPTION OF THE ILLUSTRATED EMBODIMENTS

Figure 1:
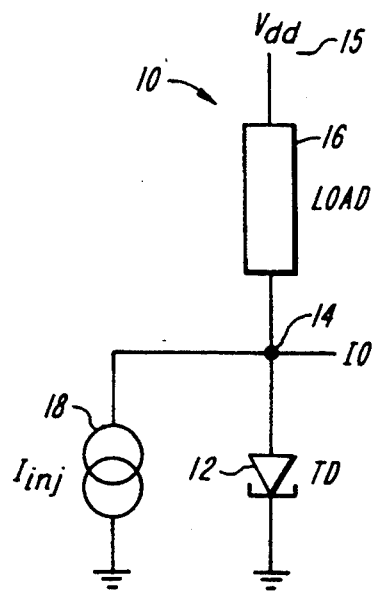
FIG. 1 shows a prior art latching circuit.

Any digital circuit will require basic elements that have two discrete states. FIG. 1 shows such a latching circuit 10. The latch 10 includes a TD 12 having its output coupled to ground. The input of the TD 12 is coupled to a common input/output (IO) node 14. A Voltage source 15 ($V_{dd}$) is coupled to the IO node 14 across a load 16. In addition, a current source 18 ($I_{inj}$) is coupled to the IO node. The current source $I_{inj}$ represents the combination of input drive currents and output load currents to which the circuit is subjected at the common input/output node 14. Both $I_{inj}$ and $V_{dd}$ may be time-varying.

Figure 2A:
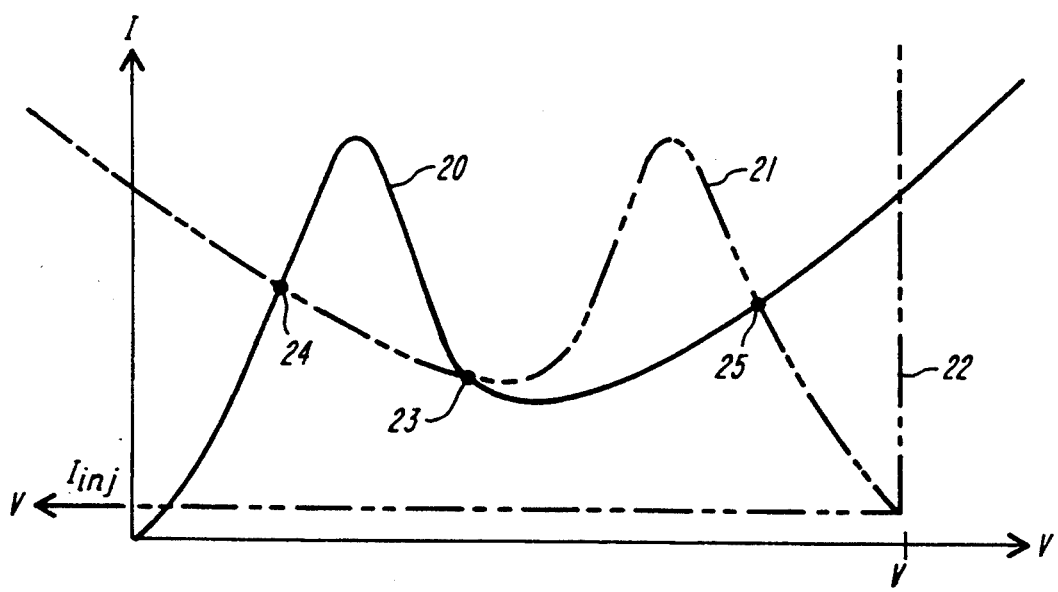
FIGS. 2A and 2B show operational I-V plots for the latching circuit of FIG. 1.

A load-line graphical analysis shown in FIGS. 2A and 2B makes it easy to visualize the operation of the circuits discussed hereinafter. FIG. 2A shows a composite current-voltage (I-V) plot 20 for the TD (solid line) and for the load device 21 (dashed line), which, in the example provided, is a second, slightly lower current TD. The I-V plot 21 for the load device has its origin at ($V_{dd}$, $I_{inj}$) and is reflected about the V=$V_{dd}$ line 22. The points where the two I-V curves cross are equilibrium states. For appropriate values of $V_{dd}$ and $I_{inj}$, as in FIG. 2A, there are three such states. The middle state 23 is unstable; the low 24 and high 25 states are stable and can represent digital logic values.

Figure 2B:
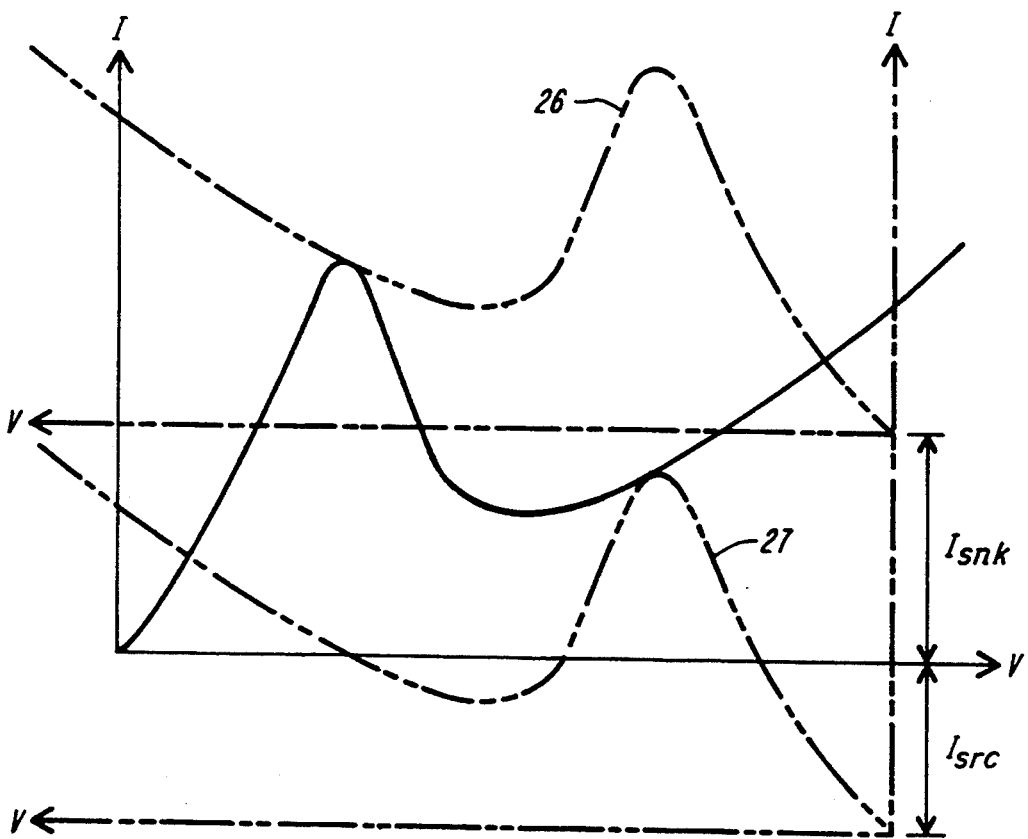

FIG. 2B presents I-V curves for the extreme values of $I_{inj}$ beyond which one of the stable states remains and the other disappears. The upper dashed curve 26 shows the maximum current, $I_{nk}$, that the latch 10 can sink while in its low state before it switches to the high state. The lower dashed curve 27 shows the maximum current, $I_{src}$, that the latch can source while in its high state before it switches to the low state.

Figure 3:
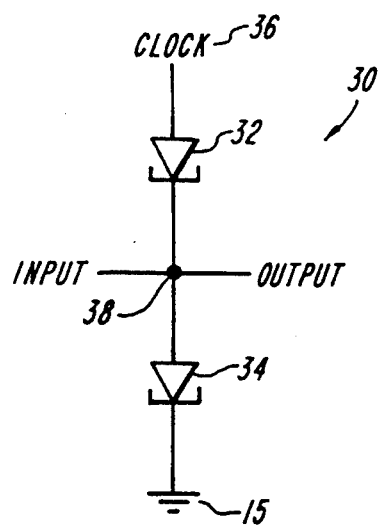
FIG. 3 shows a prior art tunnel diode latch.

FIG. 3 shows a simplified block diagram of such a conventional storage latch 30. The latch consists of a first tunnel diode 32 situated in series with a second TD 34. The output of the second TD 34 is coupled to ground, while the input of the first TD 32 is driven by a two-level clock signal 36. The node 38 where the two TDs are connected to each other serves as both the input and the output for the latch.

When the clock signal is at its high voltage level, the latch 30 will be in one of two stable states, a low state or a high state. In the low state, the second TD 34 is biased below the tunneling current peak, the first TD 32 is biased beyond the valley, and the output voltage is at its lower level. In the high state, the second TD is biased above the valley, the first TD is biased below the peak, and the output voltage is at its higher level. Latches of this type are designed in such a way that with no current injected into the input, the latch will go into the low state after the clock is pulsed momentarily to its lower voltage level. This is accomplished by making the second TD 34 larger in area (peak current) than the first TD 32.

Figure 4:
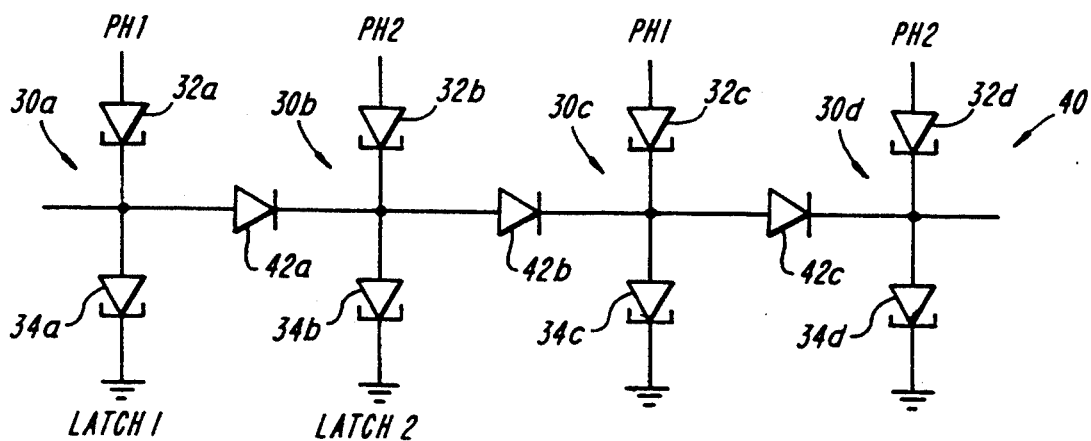
FIG. 4. shows an Aleksander tunnel diode shift register.

A shift register is created by assembling a linear array of latches with coupling elements between them such that a logic state can be transferred from one latch to the next under the control of clock signals applied to the $V_{dd}$ nodes. FIG. 4 shows a tunnel diode shift register 40 proposed by Aleksander et al., Journal Brit. I. R. E., March 1962, pp. 177–192. The illustrated register 40 shows a four stage register with latches 30a—30d utilizing Esaki tunnel diodes 32a—32d and 34a—34d. Two clock phases PH1, PH2 are applied to alternate latches, and the latches are coupled by rectifying diodes 42a-42c.

The clocks are normally at a voltage level that results in two stable states, and they are pulsed alternately to a lower voltage at which there is only one stable state. With a load TD that is slightly smaller in area (and hence peak current) than the active TD, the latches will go into the low state when no current is injected through the coupling diode, as is the case when the previous latch is in the low state. For example, consider the latches labeled "Latch 1" and "Latch 2" in FIG. 4. Latch 1 is connected to the phase-1 clock (PH1); Latch 2 is connected to the phase-2 clock (PH2). While PH1 is held high, maintaining Latch 1 in one of its stable states, PH2 is pulsed momentarily to a lower voltage. As PH2 returns to its high level, Latch 2 will go into the stable state corresponding to that of Latch 1, as hereinafter explained. If Latch 1 is in its low state, no current will be injected through the coupling diode into Latch 2, and thus Latch 2 will go into its low state.

On the other hand, if current is injected through the diode, as is the case when the previous latch is in the high state, then the latch will go into the high state. For example, if Latch 1 is in its high state, its output voltage is high enough to drive current through the coupling diode. This extra current induces Latch 2 to settle into the high state. In this way the state of Latch 1 is transferred to Latch 2. A pair of latches comprises one stage of the shift register. A complete clock cycle, in which each clock phase is successively pulsed low, is required to transfer a bit from one stage to the next, that is, from the input of Latch 1 to the output of Latch 2. In this way, the digital data will be propagated through the shift register.

Several factors determine the design margins for this kind of circuit. The most basic requirements are the following. First, to insure proper data transfer during the clocking cycle, Latch 1, when in its high state, must be able to inject enough current through the coupling diode into Latch 2 to cause Latch 2 to switch into its high state. Additionally, there are conditions relating to the static stability of the shift register. These constraints apply when both clocks are high and when latches 1 and 2 are in their high and low states, respectively.

The current flow through the coupling element must be less than the current sourcing capability of a latch in the high state ($I_{src}$) so that latch i will not drop to its low state, and less than the current sinking capability of a latch in the low state ($I_{snk}$) so that latch 2 will not switch to its high state.

The use of rectifying diodes in the Aleksander circuit is not ideal and reduces the circuit margins for meeting the above constraints. An examination of the operation of the latches shows that the transfer of a high state requires current injection only during a part of the transition of the clock from its lower level to its higher level, namely, around the point where the current peaks of the two tunnel diodes cross. This is illustrated in FIGS. 5A and 5B, where current injection only around the point shown in the middle panels causes the latch to enter the high state.

Figure 5A:
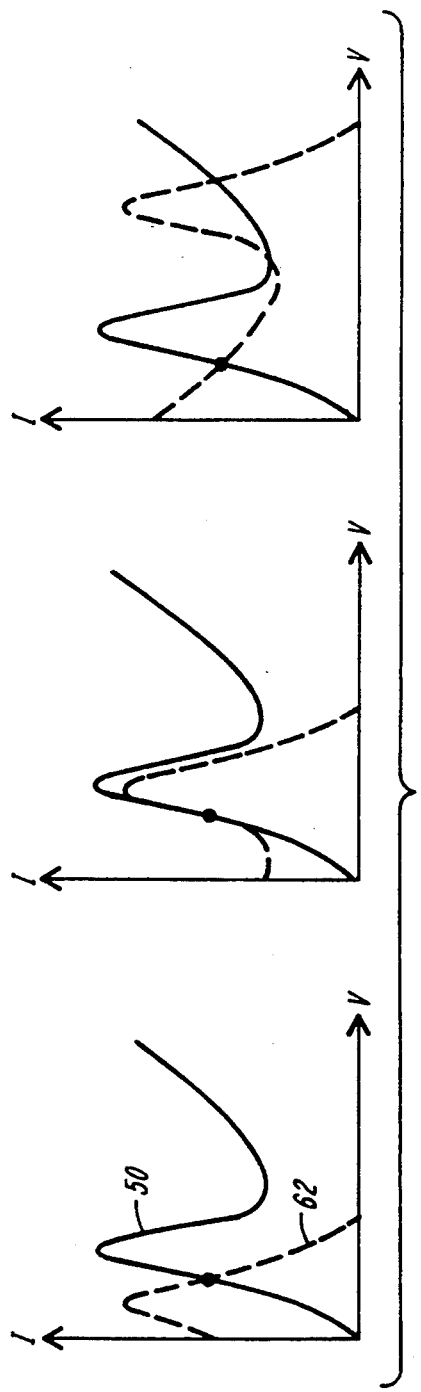
FIGS. 5A and 5B show sequences of I-V plots for the shift register of FIG. 6.
Figure 5B:
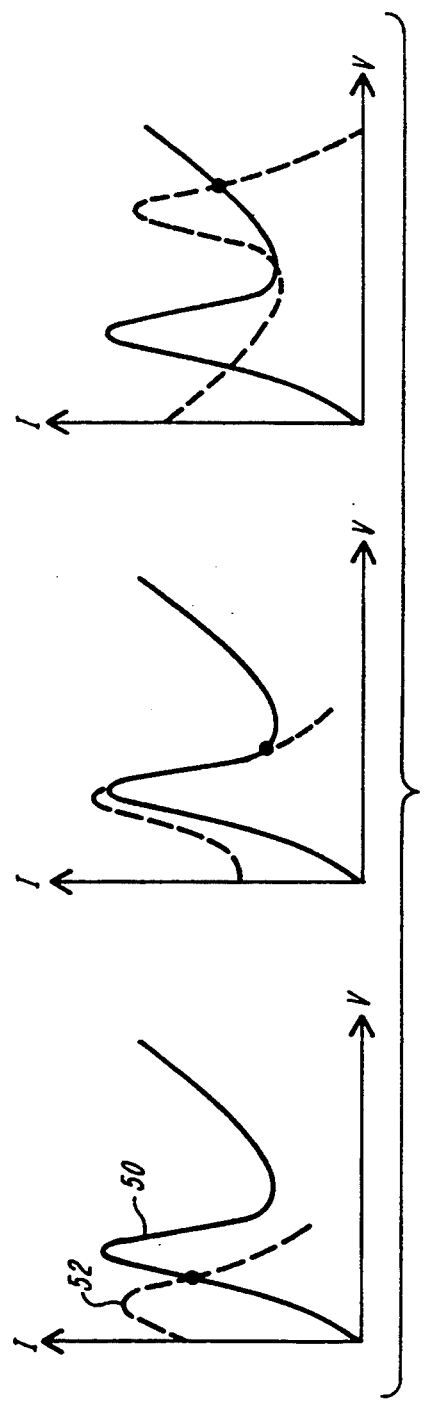

The operation is illustrated by the sequence of I-V plots shown in FIGS. 5A and 5B. Each plot includes an I-V curve 50 (solid line) and a load line 52 (dashed line). The sequence of plots shows how the state of the latch evolves as the clock voltage, having been pulsed low, returns to its normal high voltage. The plots of FIG. 5A relate to the case of no current injected into the latch, and the plots of FIG. 5B relate to current being injected into the latch. The clock voltages are low in the critical interval and high otherwise.

From the I-V curves in FIGS. 5A and 5B, it will be appreciated that there is a critical voltage interval within the positive transition of the clock during which the final state of the latch is determined. That critical interval occurs around the point when the current peaks of the two RTDs overlap, that is, when the clock voltage is approximately twice the voltage $V_{pk}$ at which the TD current reaches its peak. If the injected current during the critical interval exceeds a threshold value $I_{crit}$, then the latch will switch to the high state. Injection of current significantly outside the critical interval is not required for the transition to occur. Clearly, $I_{crit}$ must be less than both $I_{src}$ and $I_{snk}$ for the circuit to operate properly.

A conventional diode is not the ideal interstage coupling element, because its current continues to increase, and increase rapidly, as the voltage drop across it increases. If the diode is designed to provide at least the threshold current $I_{crit}$ over the critical interval during the clock cycle, then it will inject far greater current while the clock voltage is at its lowest value. At the worst, that current level may exceed $I_{src}$ of the latch in the previous stage and cause the shift register to lose information. At best, it will reduce margins, severely limiting the fan-out capability of the circuit.

Figure 6:
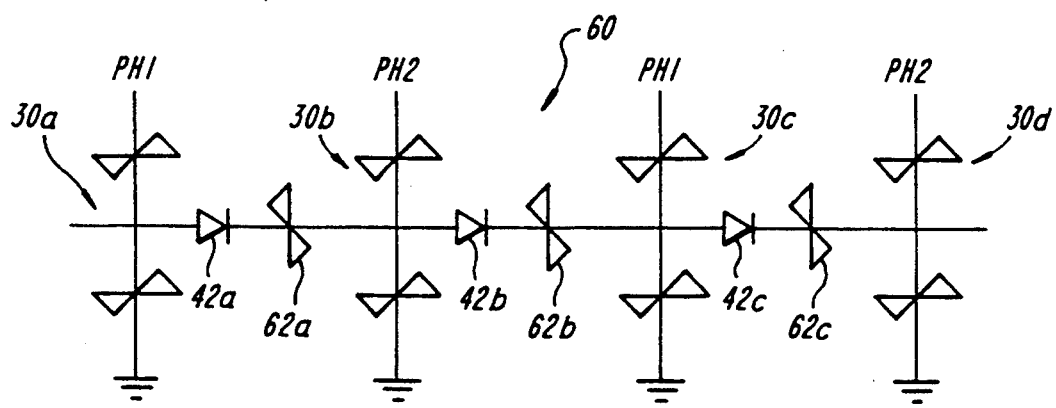
FIG. 6 shows a tunnel diode shift register utilizing tunnel diode coupling in accordance with the present invention.

With reference now to FIG. 6, a tunnel diode shift register 60 with tunnel diode coupling according to the present invention is shown. The register 60 includes latches 30a—30d coupled by rectifying diodes 42a-42c in series with respective resonant tunnel diodes 62a-62c. The RTDs 62a-62c serve as the ideal coupling element by providing current only near the critical point during the transition. While the register 60 is described herein utilizing RTDs, it will be appreciated by those of skill in the art that TDs may be implemented in the register of the present invention.

Consider the following slightly simplified analysis based on exemplary values. Assume that each latch is configured with RTDs having a current peak at $V_{pk}=0.8$ V and that the clock voltage is chosen such that the low output state of the latch is 0.5 V and the high output state is 2.2 V. The critical interval occurs approximately when the clock voltage is passing through 1.6 V (2 $V_{pk}$), at which point the latch output is at 0.8 V ($V_{pk}$). The drop across the coupling element is then 2.2 V–0.8 V=1.4 V. Thus, it is ideal to utilize a coupling element whose current peaks around 1.4 V and falls off for lower and higher voltage drops.

However, the coupling element must also rectify to provide directionality of transfer. Accordingly, the present invention involves the use of a series combination of an RTD and a conventional (Schottky) diode as the coupling element as shown in FIG. 6. Alternatively, an RTD with a sufficiently asymmetric current characteristic (low reverse current) could be used without a rectifying diode. Besides being simpler, this form of the circuit would operate at lower voltage and dissipate less power. The current peak of the coupling element in the register 60 of the present invention would occur at about 0.8 V (from the RTD) plus 0.6 V (the forward drop across the Schottky diode) or 1.4 V.

Figure 7A:
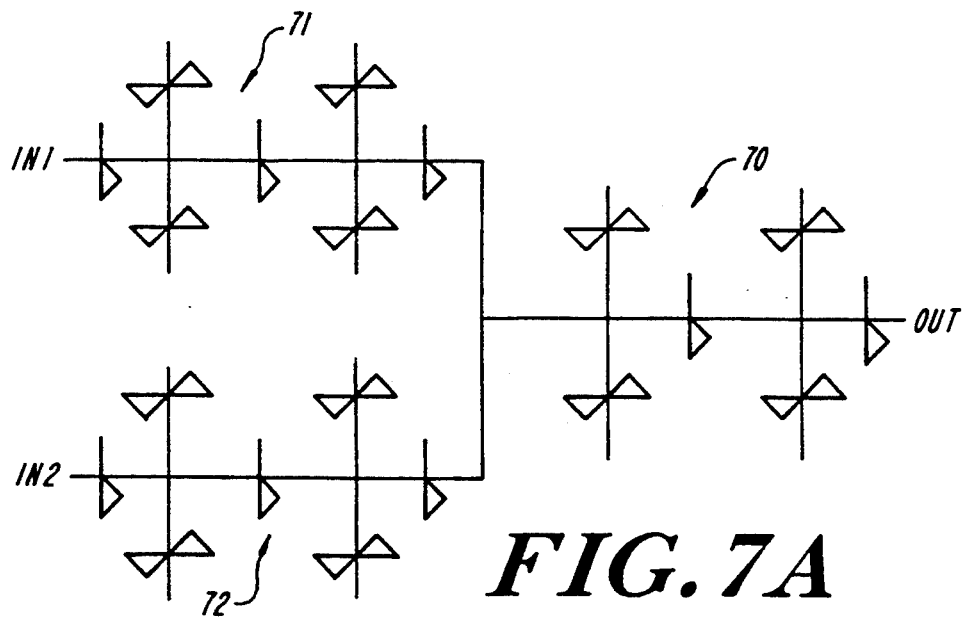
FIGS. 7A and 7B respectively show a fan-in and a fan-out register in accordance with the present invention.

Joining the signals from two shift registers (fan-in) and sending the signal from one shift register into two shift registers (fan-out) is achievable with the register 60 of FIG. 6. For fan-in operations, as shown in FIG. 7A, the input of the driven latch 70 is coupled to the outputs of two driving latches 71, 72 through independent coupling elements. This functions as an OR-gate fan-in. In the example provided, each of the latches utilizes resonant-tunnel diodes and the coupling elements are rectifying RTDs. If any driving latch is in its high state, then it will provide bias current through its coupling element and cause the driven latch to switch into its high state when it is clocked. The principal limitation with fan-in is the current sinking capability of the driven latch when it is in its low state and the driving latches are both in their high state. Clearly, for a fan-in of 2, $I_{snk}$ must be at least twice $I_{crit}$, as it is for latches configured using conventional RTDs.

Figure 7B:
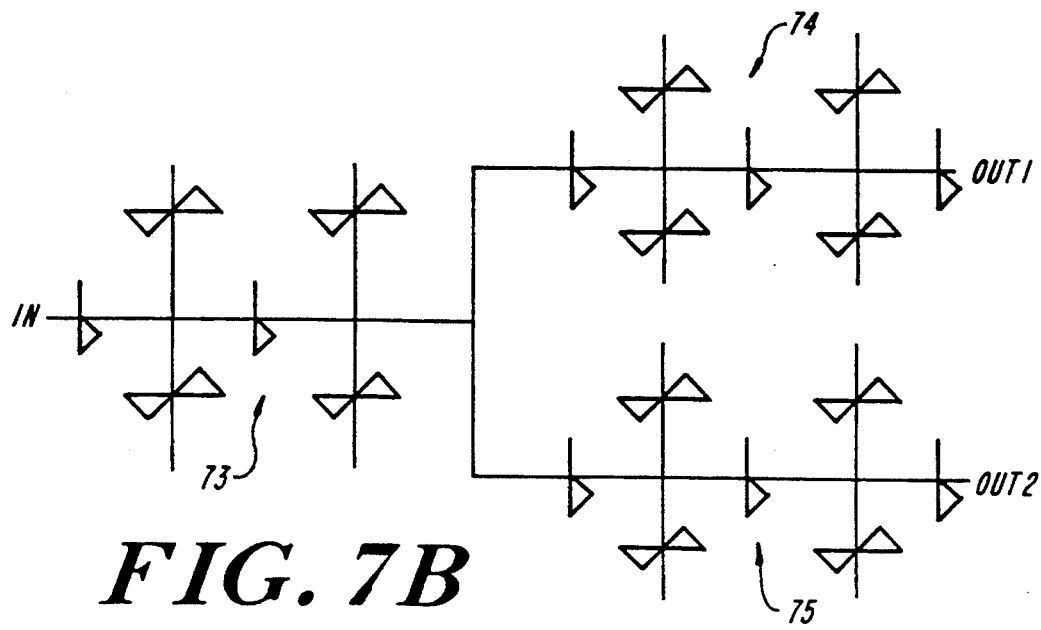

Fanning out operations are handled in a similar manner. As shown in FIG. 7B, a driving latch 73 is connected to two driven latches 74, 75 through independent coupling circuits. If the driving latch is in its high state, it will provide current through each coupling element and cause both driven latches to switch to the high state when they are appropriately clocked. The principal limitation with fan-out is the current sourcing capability of the driving latch when it is in its high state and the driven latches are in their low state. Clearly, for a fan-out of 2, $I_{src}$ must be at least twice $I_{crit}$.

The constraints on fan-in and fan-out can be relaxed by spreading the fan-in or fan-out over more than one latch. For example, a fan-out of 2 may be achieved in two steps by having one latch drive another latch with RTDs $\sqrt{2}$ or 1.4 times larger, and then having that latch drive two standard-size latches. Each latch has to achieve a fan-out of only 1.4. For achieving an ultimate fan-out of M, distributed over N latches, each successive latch will have RTDs which are $M^{1/N}$ larger than the corresponding RTDs of the previous latch. Thus, the last latch before the fan-out will have RTDs which are $M^{(N-1)/N}$ times larger than those in standard latches. The next latch in progression would have RTDs which are $M^{N/N}$ or M times larger, but at that point the output signal fans out to M separate, standard size latches. In this way, an actual fan-out of M can be achieved using latches that have to provide a fan-out of only $M^{1/N}$.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

I claim:

1. A shift register comprising:
    a first bistable latching circuit operable for switching between a low voltage state and a high voltage state in response to receiving an input current and a first clock voltage pulse;
    a second bistable latching circuit operable for switching from said low voltage state to said high voltage state in response to receiving a switching current induced from said first bistable latching circuit and a second clock voltage pulse;
    a clock voltage pulse source operable for successively providing clock voltage pulses in phase sequence to said first and second bistable latching circuits; and
    a coupling circuit coupled between and distinct from said first and second bistable latching circuits and having electrical characteristics such that said coupling circuit generates said switching current for a predetermined voltage drop across said coupling circuit in response to said first bistable latching circuit being in said high voltage state, said coupling circuit generating currents of lesser value than said switching current for voltage drops which are lesser or greater than said predetermined voltage drop.

2. The shift register of claim 1, wherein said first bistable latching circuit switches to said low voltage state in response to said input current being below a predetermined level.

3. The shift register of claim 1, wherein said second bistable latching circuit switches to said low voltage state in response to said coupling circuit generating currents lesser than said switching current.

4. The shift register of claim 1, wherein said coupling circuit comprises a negative resistance device.

5. The shift register of claim 4, wherein said coupling circuit comprises a rectifying diode in series with said negative resistance device.

6. The shift register of claim 4, wherein said negative resistance device comprises a tunnel diode.

7. The shift register of claim 6, wherein said tunnel diode comprises a rectifying tunnel diode which has sufficient asymmetric current characteristics to effect low reverse current.

8. The shift register of claim 6, wherein said switching current is approximately equivalent to the tunneling current peak associated with said tunnel diode.

9. The shift register of claim 1, wherein said first and second bistable latching circuits respectively comprise a series pair of tunnel diodes.

10. The shift register of claim 9, wherein said respective tunnel diode pairs are configured such that one end of each pair is tied to ground and the other end is coupled to said clock voltage pulse source to receive said clock voltage pulses, and wherein said tunnel diode pairs are coupled to one another at a node which serves as both an input and an output for said respective latching circuits.

11. A shift register comprising:
    a plurality of bistable latching circuits coupled to one another, each of said latching circuits being operable for switching between a low voltage state and a high voltage state in response to receiving a switching current induced from a preceding latching circuit and a clock voltage pulse;

a clock voltage pulse source operable for successively providing clock voltage pulses in phase sequence to said plurality of bistable latching circuits; and a plurality of coupling circuits respectively disposed between and electrically coupling each of said succeeding bistable latching circuits, each of said coupling circuits including a tunnel diode distinct from said latching circuits which generates said switching current in response to a preceding latching circuit being in said high voltage state.

12. The system of claim 11, wherein said tunnel diode generates said switching current for a predetermined voltage drop across said coupling circuit corresponding to said high voltage state of said preceding latching circuit, said tunnel diode generating currents of lesser value than said switching current for voltage drops which are lesser or greater than said predetermined voltage drop.

13. The shift register of claim 11, wherein said second bistable latching circuit switches to said low voltage state in response to said coupling circuit generating currents lesser than said switching current.

14. The shift register of claim 11, wherein said coupling circuit comprises a rectifying diode in series with said tunnel diode.

15. The shift register of claim 11, wherein said tunnel diode comprises a rectifying tunnel diode which has sufficient asymmetric current characteristics to effect low reverse current.

16. The shift register of claim 11, wherein said switching current is approximately equivalent to the tunneling current peak associated with said tunnel diode.

17. The shift register of claim 11, wherein each of said plurality of bistable latching circuits respectively comprise a series pair of tunnel diodes.

18. The shift register of claim 17, wherein said respective tunnel diode pairs are configured such that one end of each pair is tied to ground and the other end is coupled to said clock voltage pulse source to receive said clock voltage pulses, and wherein said tunnel diode pairs are coupled to one another at a node which serves as both an input and an output for said respective latching circuits.

19. The shift register of claim 1, wherein said register is disposed in a fan-in configuration wherein an input of said first bistable latching circuit is coupled to receive an output from a plurality of preceding registers.

20. The shift register of claim 1, wherein said register is disposed in a fan-out configuration wherein an output of said second bistable latching circuit is coupled to transmit an output to a plurality of subsequent registers.

21. The shift register of claim 20, wherein said second bistable latching circuit includes resonant-tunnel diodes which are $\sqrt{2}$ larger than resonant tunnel diodes associated with said first bistable latching circuit for a fan-out of two.

22. The shift register of claim 11, wherein said register is disposed in a fan-in configuration wherein an input of a first of said plurality of bistable latching circuits is coupled to receive an output from a plurality of preceding registers.

23. The shift register of claim 11, wherein said register is disposed in a fan-out configuration wherein an output of a last of said plurality of bistable latching circuits is coupled to transmit an output to a plurality of subsequent registers.

24. The shift register of claim 23, wherein, each of said latching circuits include resonant-tunnel diodes, said resonant-tunnel diodes being configured to be increasing in size from a first latching circuit to said last latching circuit.

25. The shift register of claim 24, wherein, for a fan-out of M distributed over N latches, said resonant-tunnel diodes increase in size such that each successive latching circuit includes resonant-tunnel diodes which are $M^{1/N}$ larger than those associated with a previous circuit, said last latching circuit in succession having resonant-tunnel diodes which are $M^{(N-1)/N}$ larger.

* * * * *